(12) United States Patent
Ripley et al.

(10) Patent No.: US 8,989,682 B2
(45) Date of Patent: Mar. 24, 2015

(54) APPARATUS AND METHODS FOR ENVELOPE TRACKING CALIBRATION

(75) Inventors: David Steven Ripley, Marion, IA (US); Sabah Khesbak, Irvine, CA (US); Benjamin Bartram, Ashwell (GB); Kevin Lee Cobley, Lower Cambourne (GB); Robert Astle Henshaw, Sudbury (GB); Julian Hildersley, Royston (GB); Robert John Thompson, Cedar Rapids, IA (US)

(73) Assignees: Skyworks Solutions, Inc., Woburn, MA (US); Nujira Ltd., Cambridge (GB)

( * ) Notice: Subject to any disclaimer, the term of this patent is extended or adjusted under 35 U.S.C. 154(b) by 100 days.

(21) Appl. No.: 13/367,190

(22) Filed: Feb. 6, 2012

(65) Prior Publication Data
US 2012/0200354 A1  Aug. 9, 2012

Related U.S. Application Data

(60) Provisional application No. 61/440,291, filed on Feb. 7, 2011.

(51) Int. Cl.
*H01Q 11/12* (2006.01)
*H03F 1/02* (2006.01)
(Continued)

(52) U.S. Cl.
CPC ............... *H03F 1/0227* (2013.01); *H03F 3/19* (2013.01); *H03F 3/245* (2013.01); *H03G 3/3042* (2013.01); *H03F 2200/102* (2013.01)
USPC .................. 455/127.1; 455/114.3; 455/115.1; 330/131

(58) Field of Classification Search
CPC . H03F 3/24; H03F 2200/511; H03F 2200/78; H03G 3/3042; H03G 3/004; H04W 52/52

USPC .................. 455/127.1, 114.3, 115.1; 330/131
See application file for complete search history.

(56) References Cited

U.S. PATENT DOCUMENTS

| 5,264,752 | A | 11/1993 | Savicki |
| 6,600,369 | B2 | 7/2003 | Mitzlaff |

(Continued)

FOREIGN PATENT DOCUMENTS

| EP | 1526636 A1 | 4/2005 |
| EP | 1806838 | 7/2007 |

(Continued)

OTHER PUBLICATIONS

Search Report and Written Opinion of Sep. 24, 2012 for International Application No. PCT/US2012/024019. 13 pages.

(Continued)

*Primary Examiner* — Yuwen Pan
*Assistant Examiner* — Fatuma Sherif
(74) *Attorney, Agent, or Firm* — Knobbe, Martens, Olson & Bear, LLP

(57) ABSTRACT

Apparatus and methods for envelope tracking calibration are provided. In one embodiment, a method of calibrating an envelope tracker having an envelope shaping table generated at a desired gain compression of a power amplifier is provided. The method includes generating a supply voltage for the power amplifier using the envelope tracker, operating the supply voltage of the power amplifier at a first voltage level associated with substantially no gain compression of the power amplifier, and measuring an output power of the power amplifier at the first voltage level. The method further includes decreasing a voltage level of the supply voltage one or more times and measuring the output power at each voltage level, determining a second voltage level of the power amplifier associated with a gain compression equal to about that of the desired gain compression, and calibrating the envelope tracker based on the determination.

23 Claims, 9 Drawing Sheets

(51) Int. Cl.
*H03F 3/19* (2006.01)
*H03F 3/24* (2006.01)
*H03G 3/30* (2006.01)

(56) References Cited

U.S. PATENT DOCUMENTS

| | | | |
|---|---|---|---|
| 6,725,021 | B1 | 4/2004 | Anderson et al. |
| 7,482,869 | B2 | 1/2009 | Wilson |
| 7,522,676 | B2 | 4/2009 | Matero |
| 2002/0030543 | A1 | 3/2002 | French et al. |
| 2002/0037705 | A1 | 3/2002 | Moerder et al. |
| 2003/0155978 | A1 | 8/2003 | Pehlke |
| 2003/0198300 | A1* | 10/2003 | Matero et al. ............... 375/297 |
| 2007/0184796 | A1* | 8/2007 | Drogi et al. ............... 455/127.1 |
| 2007/0210771 | A1 | 9/2007 | Wilson et al. |
| 2007/0249304 | A1 | 10/2007 | Snelgrove et al. |
| 2007/0273449 | A1 | 11/2007 | Wilson |
| 2007/0279019 | A1 | 12/2007 | Wilson |
| 2008/0139140 | A1* | 6/2008 | Matero et al. ............... 455/114.3 |
| 2008/0278236 | A1 | 11/2008 | Seymour |
| 2009/0128236 | A1 | 5/2009 | Wilson |
| 2009/0289720 | A1 | 11/2009 | Takinami et al. |
| 2009/0302941 | A1 | 12/2009 | Wimpenny |

FOREIGN PATENT DOCUMENTS

| | | |
|---|---|---|
| GB | 2398648 | 8/2004 |
| GB | 2409115 | 11/2006 |
| GB | 2426392 | 5/2007 |
| GB | 2411062 | 11/2007 |
| WO | WO 0158012 | 8/2001 |
| WO | WO 2009/106628 | 9/2009 |
| WO | WO 2009/106631 | 9/2009 |
| WO | WO 2009/106632 | 9/2009 |
| WO | WO 2009/127739 | 10/2009 |
| WO | WO 2009/135941 | 11/2009 |
| WO | WO 2009/138505 | 11/2009 |
| WO | WO 2009/141413 | 11/2009 |

OTHER PUBLICATIONS

Blanken et al. "A 50MHz Bandwidth Multi-Mode PA Supply Modulator for GSM, EDGE and UMTS Application," IEEE Radio Frequency Integrated Circuits Symposium, Apr. 2008, pp. 401-404.
Huang et al. "A MASH Controlled Multilevel Power Converter for High-Efficiency RF Transmitters," IEEE Transactions on Power Electronics, vol. 26, No. 4, Apr. 2011, pp. 1205-1214.
Kaneta et al. "Architecture of Wideband High-Efficiency Envelope Tracking Power Amplifier for Base Station," IEICE Technical Report, Osaka, 2009.
Kang et al. "A Multimode/Multiband Power Amplifier With a Boosted Supply Modulator," IEEE Transactions on Microwave Theory and Techniques, vol. 58, No. 10, Oct. 2010, pp. 2598-2608.
Rodriguez et al. "A Multiple-Input Digitally Controlled Buck Converter for Envelope Tracking Applications in Radiofrequency Power Amplifiers," IEEE Transactions on Power Electronics, vol. 25, No. 2, Feb. 2010, pp. 369-381.
Wu et al. "A Two-Phase Switching Hybrid Supply Modulator for Polar Transmitters with 9% Efficiency Improvement," IEEE International Solid-State Circuits Conference, Feb. 2010, pp. 196-198.
Yousefzadeh et al. "Three-Level Buck Converter for Envelope Tracking Applications," IEEE Transactions on Power Electronics, vol. 21, No. 2, Mar. 2006, pp. 549-552.
Extended European Search Report dated Oct. 14, 2014 for European Application No. 12744479.2. 8 pages.

* cited by examiner

APPARATUS AND METHODS FOR ENVELOPE TRACKING CALIBRATION

CROSS-REFERENCE TO RELATED APPLICATIONS

This application claims the benefit of priority under 35 U.S.C. §119(e) of U.S. Provisional Patent Application No. 61/440,291, filed Feb. 7, 2011 entitled "APPARATUS AND METHODS FOR ENVELOPE TRACKING CALIBRATION", which is herein incorporated by reference in its entirety.

BACKGROUND

1. Field

Embodiments of the invention relate to electronic systems, and in particular, to radio frequency (RF) electronics.

2. Description of the Related Technology

Power amplifiers can be included in mobile phones to amplify a RF signal for transmission. For example, in mobile phones having a time division multiple access (TDMA) architecture, such as those found in Global System for Mobile Communications (GSM), code division multiple access (CDMA), and wideband code division multiple access (W-CDMA) systems, a power amplifier can be used to amplify a RF signal for transmission via an antenna. It can be important manage the amplification of a RF signal, as a desired transmitted power level can depend on how far the user is away from a base station and/or the mobile environment. Power amplifiers can also be employed to aid in regulating the power level of the RF signal over time, so as to prevent signal interference from transmission during an assigned receive time slot.

The power efficiency of a power amplifier at a particular input power level can be a function of a variety of factors, including circuit component and layout, power amplifier load, and/or power amplifier supply voltage. To aid in improving the efficiency of a power amplifier, a technique known as envelope tracking can be used, in which the voltage level of the power supply of the power amplifier is changed in relation to the envelope of the RF signal. Thus, when the envelope of the RF signal increases, the voltage supplied to the power amplifier can be increased. Likewise, when the envelope of the RF signal decreases, the voltage supplied to the power amplifier can be decreased to reduce power consumption.

SUMMARY

In certain embodiments, the present disclosure relates to a method of calibrating an envelope tracking system. The method includes generating a supply voltage for a power amplifier using an envelope tracker, the envelope tracker having an envelope shaping table generated at a desired gain compression of the power amplifier. The method further includes operating the supply voltage of the power amplifier at a first voltage level, the first voltage level associated with substantially no gain compression of the power amplifier. The method further includes measuring an output power of the power amplifier at the first voltage level, decreasing a voltage level of the supply voltage one or more times and measuring the output power at each voltage level, determining a second voltage level of the power amplifier associated with a gain compression equal to about that of the desired gain compression, and calibrating the envelope tracker based on the determination.

In various embodiments, the method further includes scaling an amplitude of an envelope signal to generate a scaled envelope signal, the supply voltage generated at least in part based on the scaled envelope signal.

In some embodiments, the envelope shaping table includes shaping data relating a plurality of scaled envelope signal amplitudes to a plurality of supply voltage levels.

In a number of embodiments, the method further includes generating the supply voltage from a battery voltage using the shaping data and the scaled envelope signal.

In accordance with several embodiments, the shaping data is in a digital format, and the method further includes converting the shaping data into an analog format.

In certain embodiments, decreasing the voltage level of the supply voltage includes changing calibration data of the envelope tracker to reduce the supply voltage.

In some embodiments, calibrating the envelope tracker based on the determination includes selecting a value of the calibration data equal to about a value of the calibration data corresponding to the second voltage level.

According to a number of embodiments, scaling the amplitude of the envelope signal includes multiplying the envelope signal by a scaling factor determined at least in part by the calibration data.

In various embodiments, the scaling factor is further determined by a power control signal from a transceiver.

In some embodiments, measuring the output power of the power amplifier at the first voltage level includes measuring the output power using a directional coupler and a power detector electrically coupled to the output of the power amplifier.

In a number of embodiments, the first voltage level is equal to about a maximum supply voltage of the power amplifier.

In accordance with several embodiments, decreasing the voltage level of the supply voltage one or more times includes decreasing the voltage level in discrete steps.

In various embodiments, decreasing the voltage level of the supply voltage one or more times and measuring the output power at each voltage level includes decreasing the voltage level continuously and measuring the output power at a plurality of discrete voltage levels.

In certain embodiments, the present disclosure relates to a computer-readable storage medium including instructions that when executed by a processor perform a method of calibrating an envelope tracking system. The method includes generating a supply voltage for a power amplifier using an envelope tracker, the envelope tracker having an envelope shaping table generated at a desired gain compression of the power amplifier. The method further includes operating the supply voltage of the power amplifier at a first voltage level, the first voltage level associated with substantially no gain compression of the power amplifier. The method further includes measuring an output power of the power amplifier at the first voltage level, decreasing a voltage level of the supply voltage one or more times and measuring the output power at each voltage level, determining a second voltage level of the power amplifier associated with a gain compression equal to about that of the desired gain compression, and calibrating the envelope tracker based on the determination.

In certain embodiments, the present disclosure relates to a power amplifier system including a power amplifier and an envelope tracker configured to generate a supply voltage for the power amplifier. The envelope tracker includes a shaping module having an envelope shaping table generated at a desired gain compression of the power amplifier and a scaling module configured to scale an amplitude of an envelope signal and to provide the scaled envelope signal amplitude to the shaping module. The power amplifier system further includes a directional coupler electrically connected to an output of the power amplifier, a power detector electrically connected to the directional coupler and configured to measure the output power of the power amplifier using the directional coupler, and a calibration module configured to provide calibration data to the scaling module so as to change the scaled envelope signal amplitude generated by the scaling module. The calibration module is configured to set the calibration data to a first value corresponding to a voltage level of the supply voltage associated with substantially no gain compression, and to reduce the voltage level of the supply voltage by changing the calibration data until the power detector indicates that the gain compression of the power amplifier is equal to about the desired gain compression.

In various embodiments, the envelope shaping table includes shaping data relating a plurality of scaled envelope signal amplitudes to a plurality of supply voltage levels.

In some embodiments, the power amplifier system further includes a modulator configured to generate the supply voltage from a battery voltage using the shaping data.

In a number of embodiments, the power amplifier system further includes a digital-to-analog converter for converting the shaping data to analog data for use by the modulator.

In accordance with several embodiments, the power amplifier system further includes a power control module electrically connected to the power detector.

In certain embodiments, the scaling module is further configured to receive a power control signal from the power control module and to change the scaled envelope signal amplitude using the power control signal.

In some embodiments, the scaling module is configured to multiply the calibration data by the power control signal to generate a scaling factor, and to multiply the amplitude of the envelope signal by the scaling factor to generate the scaled envelope signal amplitude.

In various embodiments, the first value of the calibration data corresponds to about a maximum supply voltage of the power amplifier.

In some embodiments, the power amplifier system further includes a duplexer having an input electrically connected to an output of the power amplifier and to the directional coupler and an output electrically connected to an antenna.

In certain embodiments, the present disclosure relates to a method of calibrating a power amplifier system. The method includes generating a supply voltage for a power amplifier using an envelope tracker, the envelope tracker having an envelope shaping table generated at a desired gain compression of the power amplifier. The method further includes operating the supply voltage of the power amplifier at a first voltage level and a first input power level associated with a target power of the power amplifier. The method further includes measuring an output power of the power amplifier at the first input power level to determine a power gain, increasing the input power of the power amplifier one or more times and measuring the output power at each input power level, determining a second input power level corresponding to a gain compression of the power amplifier equal to about the desired gain compression, and calibrating the power amplifier system based on the determination.

In various embodiments, the method further includes using calibration data to change a gain of a variable gain amplifier configured to drive an input of the power amplifier.

In some embodiments, increasing the input power of the power amplifier one or more times includes changing the calibration data so as to increase a gain of the variable gain amplifier one or more times.

In a number of embodiments, calibrating the power amplifier system based on the determination includes selecting a value of the calibration data equal to about a value of the calibration data corresponding to the second input power level.

In certain embodiments, the method further includes using a power control signal from a transceiver to further control the gain of the variable gain amplifier.

According to a number of embodiments, the method further includes controlling the gain of the variable gain amplifier by multiplying the calibration data by the power control signal.

In several embodiments, measuring the output power of the power amplifier at the first input power level to determine the power gain includes measuring the output power using a directional coupler and a power detector electrically coupled to the output of the power amplifier.

In certain embodiments, the present disclosure relates to a computer-readable storage medium including instructions that when executed by a processor perform a method of calibrating a power amplifier system. The method includes generating a supply voltage for a power amplifier using an envelope tracker, the envelope tracker having an envelope shaping table generated at a desired gain compression of the power amplifier. The method further includes operating the supply voltage of the power amplifier at a first voltage level and a first input power level associated with a target power of the power amplifier. The method further includes measuring an output power of the power amplifier at the first input power level to determine a power gain, increasing the input power of the power amplifier one or more times and measuring the output power at each input power level, determining a second input power level corresponding to a gain compression of the power amplifier equal to about the desired gain compression, and calibrating the power amplifier system based on the determination.

In certain embodiments, the present disclosure relates to a power amplifier system including a power amplifier, a variable gain amplifier configured to drive an input of the power amplifier, and an envelope tracker configured to generate a supply voltage for the power amplifier. The envelope tracker includes an envelope shaping table generated at a desired gain compression of the power amplifier. The power amplifier system further includes a directional coupler electrically connected to an output of the power amplifier, a power detector electrically connected to the directional coupler and configured to measure the output power of the power amplifier using the directional coupler, and a calibration module configured to provide calibration data to the variable gain amplifier so as to control the input power of the power amplifier. The calibration module is configured to set the calibration data to a first value corresponding to a voltage level of the supply voltage and input power of the power amplifier associated with a target power of the power amplifier, and to increase the input power of the power amplifier by changing the calibration data until the power detector indicates that the gain compression of the power amplifier is equal to about the desired gain compression.

In various embodiments, the power amplifier system further includes a power control module electrically connected to the power detector.

In some embodiments, the power control module is configured to generate a power control signal for controlling the gain of the variable gain amplifier.

In a number of embodiments, the power amplifier system includes a multiplier for multiplying the calibration data by the power control signal to generate a gain control signal for controlling the gain of the variable gain amplifier.

In accordance with certain embodiments, the power amplifier system further includes a duplexer having an input electrically connected to an output of the power amplifier and to the directional coupler and an output electrically connected to an antenna.

DETAILED DESCRIPTION OF EMBODIMENTS

The headings provided herein, if any, are for convenience only and do not necessarily affect the scope or meaning of the claimed invention.

It can be difficult to maintain certain performance characteristics of a power amplifier when varying the power amplifier supply voltage in relation to the envelope of the RF signal. For example, part-to-part component variation within the system can produce a misalignment between an envelope voltage and an associated power supply voltage generated by the envelope tracker, thereby making it difficult to maintain a relatively constant gain compression when tracking an envelope signal over a wide dynamic range. Although a power amplifier can be calibrated to try to compensate for the error, the calibration can be complicated by variations in DC offset voltage, insertion loss and/or gain in the envelope and signal paths.

There is a need for improved power amplifiers. Furthermore, there is a need for improved apparatus and methods for envelope tracking calibration.

Figure 1:
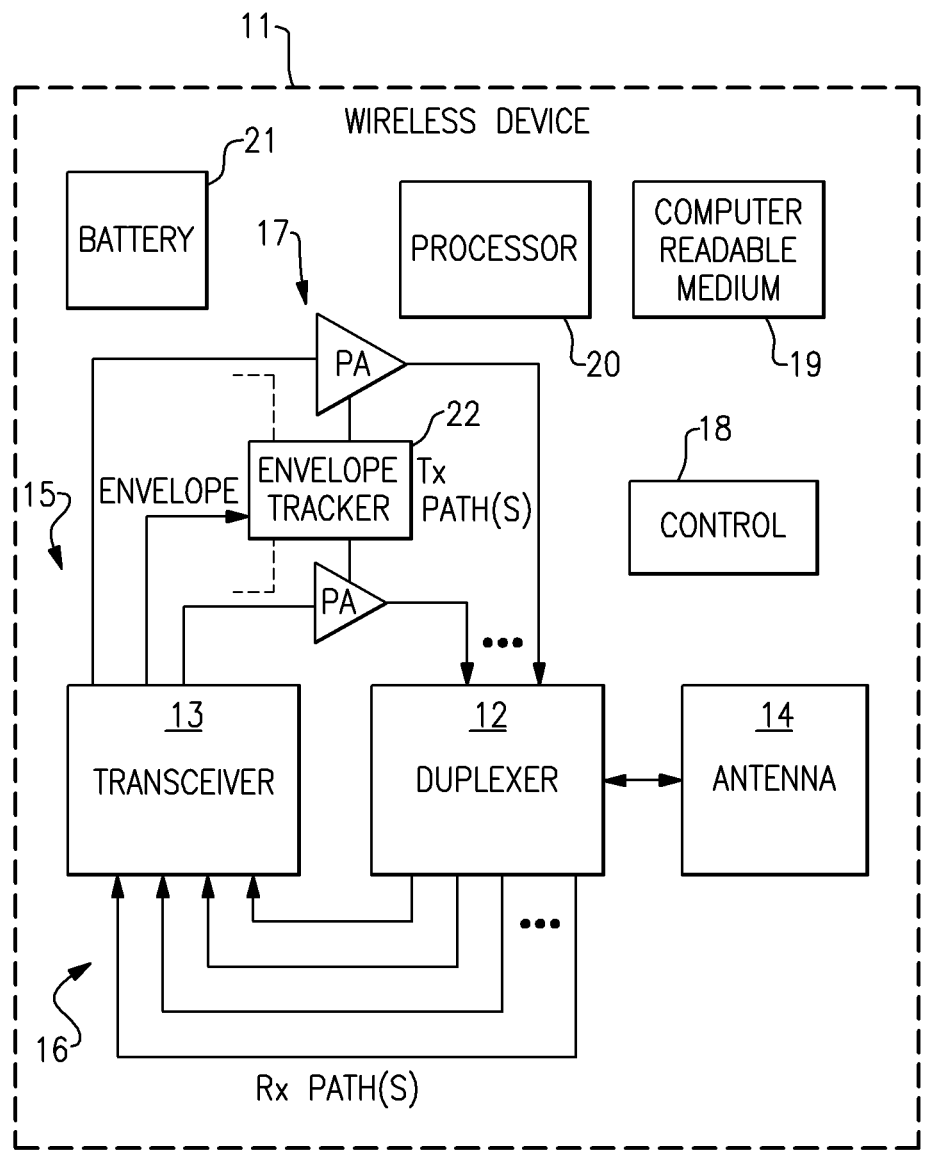
FIG. 1 is a schematic block diagram of an example wireless device that can include one or more power amplifier modules.

FIG. 1 is a schematic block diagram of an example wireless device 11 that can include one or more power amplifier modules. The wireless device 11 can include power amplifiers implementing one or more features of the present disclosure.

The example wireless device 11 depicted in FIG. 1 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain WCDMA and Long Term Evolution (LTE) devices can operate over, for example, about 22 radio frequency spectrum bands.

One or more features of the present disclosure can be implemented in the foregoing example modes and/or bands, and in other communication standards. For example, 3G, 4G, LTE and Advanced LTE are non-limiting examples of such standards.

In certain embodiments, the wireless device 11 can include a duplexer 12, a transceiver 13, an antenna 14, power amplifiers 17, a control component 18, a computer readable medium 19, a processor 20, a battery 21, and an envelope tracker 22.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 1 as the transceiver 13. For example, transmitting and receiving functionalities can be provided by separate components.

Similarly, it will be understood that various antenna functionalities associated with the transmission and receiving of RF signals can be achieved by one or more components that are collectively represented in FIG. 1 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with one or more antennas.

In FIG. 1, one or more output signals from the transceiver 13 are depicted as being provided to the antenna 14 via one or more transmission paths 15. In the example shown, different transmission paths 15 can represent output paths associated with different bands and/or different power outputs. For example, two example power amplifiers 17 shown can represent amplifications associated with different power output configurations (e.g., low power output and high power output), and/or amplifications associated with different bands. Although FIG. 1 illustrates the wireless device 11 as including two transmission paths 15, the wireless device 11 can be adapted to include more or fewer transmission paths 15.

In FIG. 1, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with. Although FIG. 1 illustrates the wireless device 11 as including four receiving paths 16, the wireless device 11 can be adapted to include more or fewer receiving paths 16.

To facilitate switching between receive and transmit paths, the duplexer 12 can be configured to electrically connect the antenna 14 to a selected transmit or receive path. Thus, the duplexer 12 can provide a number of switching functionalities associated with an operation of the wireless device 11. In certain embodiments, the duplexer 12 can include a number of switches configured to provide functionalities associated with, for example, switching between different bands, switching between different power modes, switching between transmission and receiving modes, or some combination thereof. The duplexer 12 can also be configured to provide additional functionality, including filtering of signals.

FIG. 1 shows that in certain embodiments, a control component 18 can be provided, and such a component can be configured to provide various control functionalities associated with operations of the duplexer 12, the power amplifiers 17, the envelope tracker 22, and/or other operating component(s). Non-limiting examples of the control component 18 are described herein in greater detail.

In certain embodiments, a processor 20 can be configured to facilitate implementation of various processes described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 19 that can direct a computer or other programmable data processing apparatus to operate in a particular manner, such that the instructions stored in the computer-readable memory produce an article of manufacture including instruction means which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide steps for implementing the acts specified in the flowchart and/or block diagram block or blocks.

The illustrated wireless device 11 also includes the envelope tracker 22, which can be used to provide a power supply voltage to one or more of the power amplifiers 17. For example, the envelope tracker 22 can be configured to control the supply voltage provided to the power amplifiers 17 based upon an envelope of the RF signal to be amplified.

The envelope tracker 22 can be electrically connected to a battery 21, and the envelope tracker 22 can be configured to vary or change the voltage provided to the power amplifiers 17 based on an envelope of the RF signal to be amplified. The battery 21 can be any suitable battery for use in the wireless device 11, including, for example, a lithium-ion battery. As will be described in detail further below, by controlling the voltage provided to the power amplifiers, the power consumption of the battery 21 can be reduced, thereby improving performance of the wireless device 11. The envelope signal can be provided to the envelope tracker 22 from the transceiver 13. However, the envelope signal can be determined in other ways. For example, the envelope signal can be determined by detecting the envelope of the RF signal using any suitable envelope detector.

Figure 2:
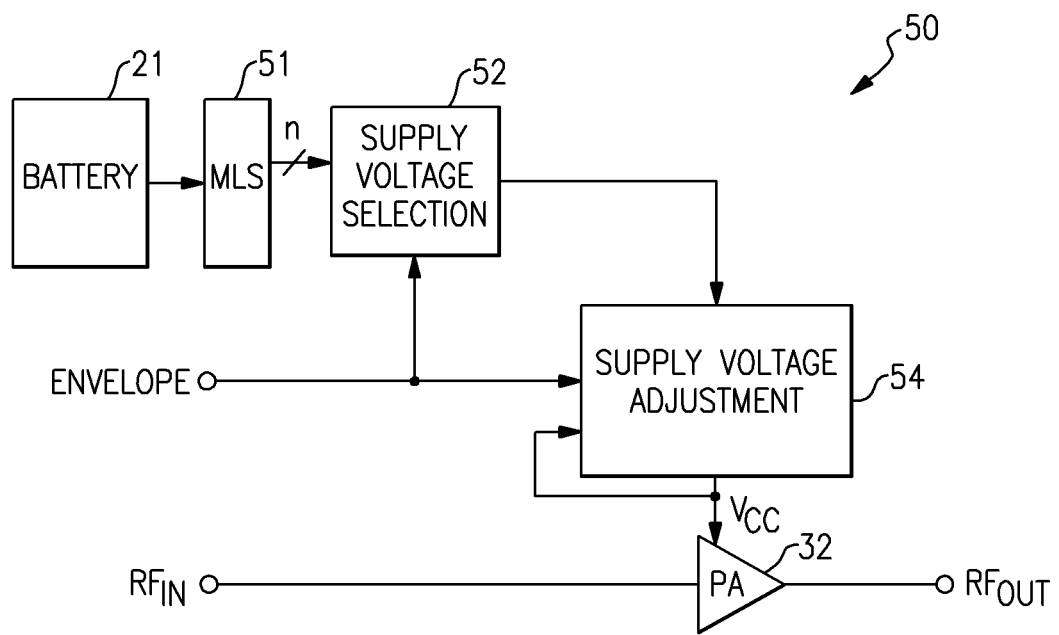
FIG. 2 is a schematic block diagram of one example of a power amplifier system having an envelope tracker.

FIG. 2 is a schematic block diagram of one example of a power amplifier system 50 having an envelope tracker. The illustrated power amplifier system 50 includes the battery 21, a power amplifier 32, a multi-level supply module 51, a supply voltage selection module 52, and a supply voltage adjustment module 54. As will be described below, the multi-level supply module 51, the supply voltage selection module 52, and the supply voltage adjustment module 54 can collectively operate as an envelope tracker configured to vary or change a power supply voltage $V_{CC}$ in relation to the envelope signal.

The power amplifier 32 includes an input configured to receive an RF signal $RF_{IN}$ and an output configured to generate an amplified RF signal $RF_{OUT}$. Additionally, the power amplifier 32 is electrically powered using the power supply voltage $V_{CC}$.

The multi-level supply module 51 can generate a plurality of power supplies from the battery 21. For example, the multi-level supply module 51 can be used to generate n supplies from the battery 21, where n is an integer. Each of the supplies generated by the multi-level supply module 51 can have a voltage level that is greater than, less than, or equal to the battery voltage. In one implementation, the multi-level supply module 51 includes a buck-boost converter.

The supply voltage selection module 52 can receive the envelope of the RF signal $RF_{IN}$, and can select amongst the supplies generated by the multi-level supply module 51 to provide the supply voltage adjustment module 54 with a supply voltage level that is most appropriate to use to track the envelope signal. For example, the supply voltage selection module 52 can provide the supply voltage adjustment module 54 a supply voltage that is greater than the envelope voltage by a relatively small amount. Thereafter, the supply voltage adjustment module 54 can provide relatively fine-tuned adjustment of the supply voltage to generate the envelope tracking power supply voltage $V_{CC}$. By including the multi-level supply module 51, the supply voltage selection module 52, and the voltage adjustment module 54, constraints on the design of the envelope tracking system can be reduced, thereby permitting a system with greater flexibility and improved power efficiency relative to a scheme employing only a single tracking or selection module.

As illustrated in FIG. 2, the supply voltage adjustment module 54 can be electrically connected in a feedback arrangement to aid in enhancing the tracking of the power supply $V_{CC}$ relative to the envelope of the RF signal. The supply voltage adjustment module 54 can include one or more amplifiers configured to provide linear tracking of the envelope signal to generate the power supply voltage $V_{CC}$. In certain implementations, one or more amplifiers can be electrically connected with one or more summers to aid in aid in generating an error signal, which can be added to the supply voltage selected by the supply voltage selection module 52. Although FIG. 2 illustrates a feedback configuration in which the power supply voltage $V_{CC}$ is provided as an input back into the supply voltage adjustment module 54, in certain implementations, a feedforward arrangement can be used.

Although not illustrated in FIG. 2, the power amplifier system 50 can include a delay block to compensate for delays in generating the power supply voltage $V_{CC}$. For example, a delay block can be included between the RF signal $RF_{IN}$ and the input of the power amplifier 32 to aid in aligning the signal amplified by the power amplifier 32 with the power supply voltage $V_{CC}$.

Figure 3A:
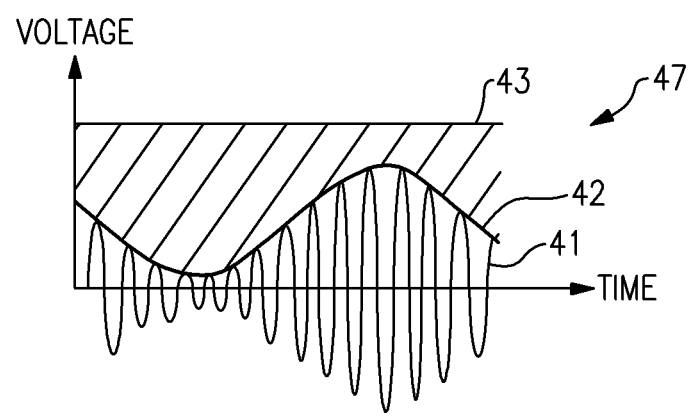
FIGS. 3A-3B show two examples of a power supply voltage versus time.
Figure 3B:
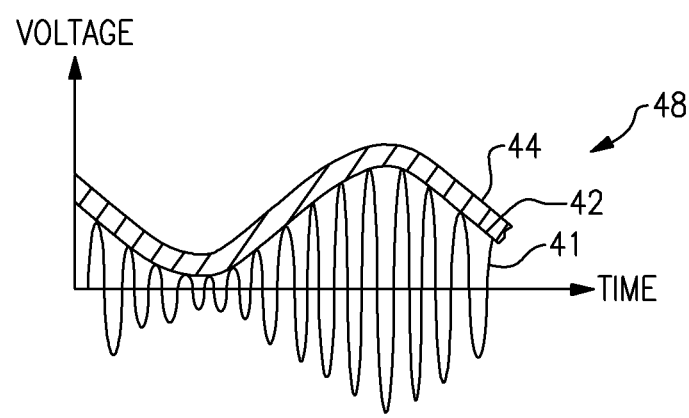

FIGS. 3A-3B show two examples of power supply voltage versus time.

In FIG. 3A, a graph 47 illustrates the voltage of an RF signal 41 and a power amplifier supply 43 versus time. The RF signal 41 has an envelope 42.

The power supply 43 of a power amplifier can be configured to have a voltage greater than that of the RF signal 41. For example, providing a supply voltage to a power amplifier having a voltage magnitude less than that of the RF signal 41 can clip the RF signal, thereby creating signal distortion and/or other problems. Thus, the power supply 43 can be selected to have a voltage magnitude that is greater than that of the envelope 42 of the RF signal 41. However, it can be desirable to reduce a difference in voltage between the power supply 43 and the envelope 42 of the RF signal 41, as the area between the power amplifier supply 43 and the envelope 42 of the RF signal 41 can represent lost energy, which can reduce battery life and increase heat generated in a mobile device.

In FIG. 3B, a graph 48 illustrates the voltage of an RF signal 41 and a power amplifier supply 44 versus time. In contrast to the power amplifier supply 43 of FIG. 3A, the power amplifier supply 44 of FIG. 3B changes in relation to the envelope 42 of the RF signal 41. The area between the power amplifier supply 44 and the envelope 42 of the RF signal 41 in FIG. 3B is less than the area between the power amplifier supply 43 and the envelope 42 of the RF signal 41 in FIG. 3A, and thus the graph 48 of FIG. 3B can be associated with a power amplifier system having greater energy efficiency. FIG. 3B can represent the output of one example of an envelope tracking system, such as the envelope tracking systems described herein.

Figure 4:
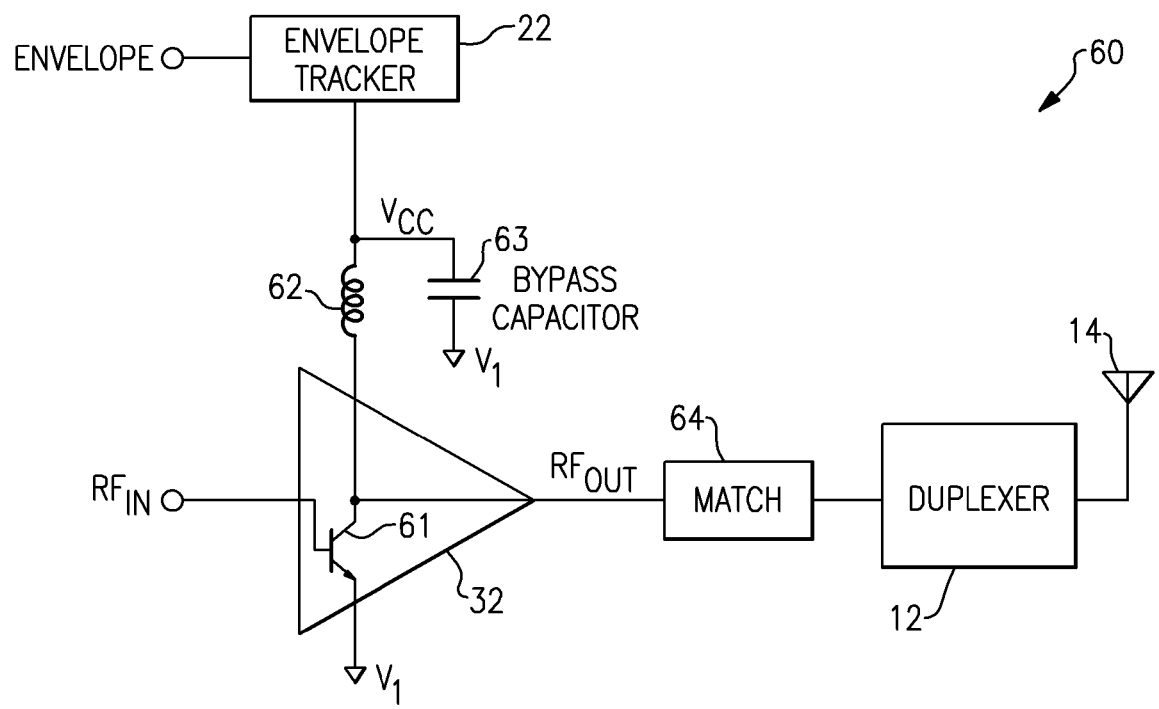
FIG. 4 is a schematic block diagram of another example of a power amplifier system having an envelope tracker.

FIG. 4 is a schematic block diagram of another example of a power amplifier system 60 having an envelope tracker 22. The illustrated power amplifier system 60 includes the envelope tracker 22, a power amplifier 32, an inductor 62, a bypass capacitor 63, an impedance matching block 64, the duplexer 12, and the antenna 14.

The power amplifier 32 can receive a RF signal $RF_{IN}$ and generate an amplified RF signal $RF_{OUT}$. The envelope tracker 22 can receive an envelope of the RF signal $RF_{IN}$ and can generate a power amplifier supply voltage $V_{CC}$ for the power amplifier 32 that tracks the envelope signal.

The illustrated power amplifier 32 includes a bipolar transistor 61 having an emitter, a base, and a collector. The emitter of the bipolar transistor 61 can be electrically connected to a first voltage supply $V_1$, which can be, for example, a ground supply or node. Additionally, the RF signal $RF_{IN}$ can be provided to the base of the bipolar transistor 61. The bipolar transistor 61 can amplify the RF signal $RF_{IN}$ to generate the amplified RF signal $RF_{OUT}$ at the collector. The bipolar transistor 61 can be any suitable device. In one implementation, the bipolar transistor 61 is a heterojunction bipolar transistor (HBT).

The power amplifier 32 can be configured to provide the amplified RF signal $RF_{OUT}$ to the duplexer 12. The impedance matching block 64 can be used to aid in terminating the electrical connected between the power amplifier 32 and the duplexer 12. For example, the impedance matching block 64 can be used to increase power transfer and/or reduce reflections of the amplified RF signal $RF_{OUT}$. In certain implementations, the inductor 62 can be configured to operate as part of the impedance matching block 64.

The inductor 62 can be included to aid in biasing the power amplifier 32 with the power amplifier supply voltage $V_{CC}$ generated by the envelope tracker 22. The inductor 62 can include a first end electrically connected to the envelope tracker 22, and a second end electrically connected to the collector of the bipolar transistor 61. The bypass capacitor 63 can have a first end electrically connected to the power supply $V_{CC}$ and a second end electrically connected to the first voltage supply $V_1$, and can perform a wide variety of functions. For example, including the bypass capacitor 63 can reduce noise of the supply voltage $V_{CC}$ and/or stabilize the output of the power amplifier 32. Additionally, the bypass capacitor 63 can be used to provide an RF and/or AC ground for the inductor 62.

Although FIG. 4 illustrates one implementation of the power amplifier 32, skilled artisans will appreciate that the teachings described herein can be applied to a variety of power amplifier structures, including, for example, multi-stage power amplifier structures and power amplifiers employing other transistor structures. For example, in some implementations the bipolar transistor 61 can be omitted in favor of employing a field-effect transistor (FET), such as a silicon FET, a gallium arsenide (GaAs) high electron mobility transistor (HEMT), or a laterally diffused metal oxide semiconductor (LDMOS) transistor.

Figure 5:
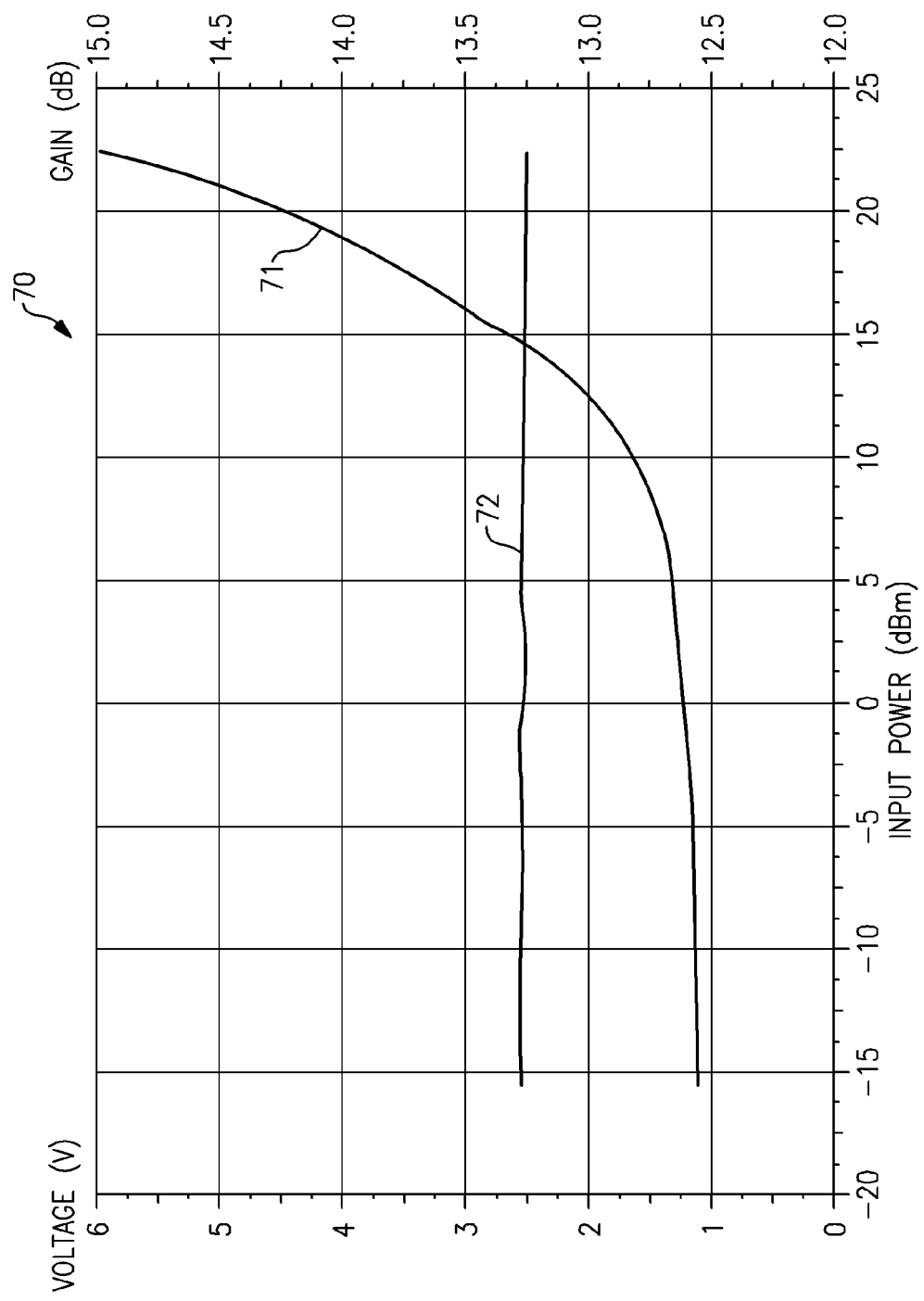
FIG. 5 is a plot illustrating one example of supply voltage and gain versus input power.

FIG. 5 is a plot 70 illustrating one example of supply voltage and gain versus input power. The plot 70 includes a first curve 71 illustrating a power amplifier's power supply voltage in volts versus input power in dBm. The plot 70 further includes a second curve 72 illustrating power amplifier gain in dB versus power amplifier input power in dBm for the power amplifier.

The first and second curves 71, 72 illustrate that the gain of a power amplifier can be maintained relatively constant as input power increases by increasing a power supply voltage level of a power amplifier in relation to the input power. For example, the gain shown in the second curve 72 has been maintained relatively constant at a magnitude of about 13.25 dB by increasing the power supply voltage from about 1 V to about 6 V when increasing the input power level from about −15 dBm to about 22 dBm.

When performing envelope tracking, a relatively constant gain compression of the power amplifier can be maintained by controlling the difference between the power supply voltage level and the input power of the envelope signal. To aid in controlling the amplitude of the power supply voltage relative to the amplitude of the envelope signal, an envelope tracker can include an envelope shaping table generated at a target gain compression that includes data relating a plurality of desired voltage supply amplitudes to a plurality of envelope signal amplitudes.

When using an envelope shaping table, part-to-part variations of components within the power amplifier system can introduce variation that can create a misalignment between the generated power supply voltage and the actual input power. For example, offset voltages, power amplifier gain errors, and/or a variety of other factors can lead to a misalignment between the amplitude of the power supply and the input power of the envelope signal. It can be difficult to compensate for these errors using conventional calibration techniques for a variety of reasons. For example, the power amplifier can include a duplexer electrically connected between the output of the power amplifier and the antenna, and variation in insertion loss of the duplexer can make it difficult to correlate power measurements at the antenna to the power supply voltage of the power amplifier. Thus, duplexer loss uncertainty and/or other losses between the power amplifier output and the antenna can complicate calibration.

To accommodate for part-to-part variations and/or other contributing factors to envelope amplitude misalignment, a power amplifier system can be designed to include margin to account for the envelope amplitude misalignment error. For example, gain compression can exist near a maximum output power level of an amplifier and can introduce distortion in the RF signal, and a power amplifier can be operated with an increased power supply voltage to provide additional headroom against distortion. However, increasing the power supply voltage can reduce the efficiency of the power amplifier.

There is a need for improving the calibration of a power amplifier system so as to increase power amplifier efficiency and to avoid distortion of an amplified RF signal due to envelope amplitude misalignment. Furthermore, there is a need for a calibration schemes that have a relatively fast calibration time so as to reduce calibration cost in a factory setting and/or to permit the use of the calibration method dynamically in a mobile device operating environment. Moreover, there is a need for improved calibration systems that can account for duplexer loss uncertainty and/or losses between the output of a power amplifier and an antenna.

Figure 6:
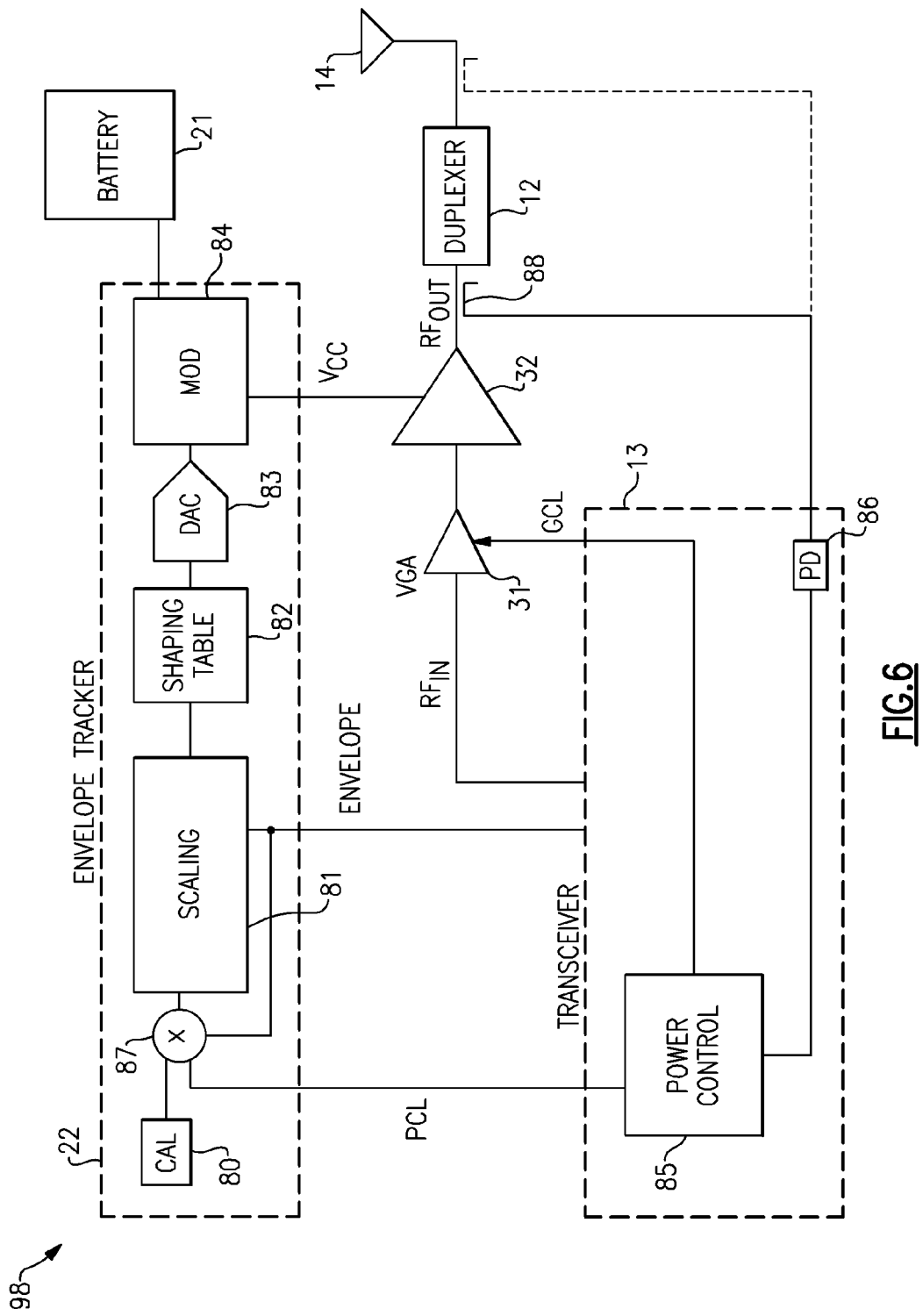
FIG. 6 is a schematic block diagram of a power amplifier system in accordance with one embodiment.

FIG. 6 is a schematic block diagram of a power amplifier system 98 in accordance with one embodiment. The power amplifier system 98 includes a duplexer 12, a transceiver 13, an antenna 14, a battery 21, an envelope tracker 22, a power amplifier input stage or variable gain amplifier (VGA) 31, a power amplifier 32, and a directional coupler 88.

The illustrated envelope tracker 22 includes a calibration module 80, a scaling module 81, a shaping table module 82, a digital-to-analog converter 83, a modulator 84, and a multiplier 87. The illustrated transceiver 13 includes a power control module 85 and a power detector 86. As will be described in detail below, the calibration module 80 of the envelope tracker 22 can be used to calibrate the envelope tracker 22 to accommodate for envelope amplitude misalignment.

The illustrated transceiver 13 is configured to provide an envelope signal to the envelope tracker 22 and an RF signal $RF_{IN}$ to the VGA 31. The transceiver 13 includes the power control module 85, which can be used to adjust a power level of the power amplifier system 98. For example, the power control module 85 can provide a first power control signal or gain control level (GCL) to the VGA 31, which can be used to control a gain of the VGA 31. Additionally, the power control module 85 can provide a second power control signal or power control level (PCL) to the envelope tracker 22, which can be used to scale the amplitude of the envelope signal. The power control module 85 can be used to control the power level of the power amplifier system 98 over a variety of power modes and/or other power settings and to compensate for various system and/or operational parameters that can impact power performance.

To aid in enhancing the accuracy of the power control module 85, the transceiver 13 can include the power detector 86. The power detector 86 can be electrically coupled to a directional coupler 88 positioned at the output of the power amplifier 32 so as to improve output power measurement accuracy. For example, the directional coupler 88 can be positioned between the output of the power amplifier 32 and the input of the duplexer 12, thereby allowing the power detector 86 to generate a power measurement that does not include an insertion loss of the duplexer 12. However, in certain implementations, the directional coupler 88 need not be positioned directly at the output of the power amplifier 32. For example, FIG. 6 has illustrated in dashed lines an alternative location for the directional coupler 88 between the duplexer 12 and the antenna 14.

The scaling module 81 can receive the power control level (PCL) from the power control module 85, and can use the PCL to scale an amplitude of the envelope signal. The scaled or amplified envelope signal can be provided to the shaping table module 82, which can include a shaping table having shaping data relating a plurality of scaled envelope signal amplitudes to a plurality of target supply voltage levels. The shaping table can be generated at a particular target gain compression, as was described above with reference to FIG. 5.

The shaping table module 82 can generate a signal including data indicating a desired supply voltage level, and provide the signal to a modulator 84. In implementations in which the signal is a digital format, such as in configurations in which the signal corresponds to an entry from the shaping table, the digital-to-analog converter 83 can be used to convert the signal to an analog format. The modulator 84 can be electrically connected to the battery 21, and can use the data relating to the target supply voltage level from the shaping table module 82 to generate the power supply voltage $V_{CC}$ for the power amplifier 32.

The envelope tracker 22 includes the calibration module 80, which includes calibration data that can be set to a variety of values. The calibration data can be provided to the scaling module 81, which can use the calibration data to scale the amplitude of the envelope signal before providing the scaled amplitude signal to the shaping table module 82. For example, as illustrated in FIG. 6, the multiplier 87 can be configured to multiply the calibration data from the calibration module 80 by the power control level (PCL) from the power control module 85 and by the envelope signal to generate a scaled envelope signal. However, the scaling module 81 can use the calibration data to scale the envelope signal in any suitable way.

The calibration module 80 can use the calibration data to calibrate the envelope tracker 22 to correct for envelope amplitude misalignment using a multi-step calibration process. For example, the calibration module 80 can begin by setting the calibration data to a value that scales the envelope signal value by a relatively large amount, thereby directing the shaping table module 82 to set the power supply voltage $V_{CC}$ to a relatively high value, such as a maximum power supply voltage of the power amplifier. The relatively high voltage of the power supply can correspond to substantially no gain compression of the power amplifier 32.

When the power amplifier system is configured to have substantially no gain compression as was described above, the power detector 86 can be configured to measure the output power of the power amplifier 32. Thereafter, the calibration module 80 can change the state or value of the calibration data so as to direct the target supply voltage generated by the shaping table module 82 downward. For example, the scaling module 81 can use the calibration data to reduce the scaling factor, thereby causing the shaping table module 82 to decrease the target power supply voltage.

For each decrease of power supply voltage, the power detector 86 can measure the output power, and provide the output power measurement to the power control module 85. Using the information, the calibration module 80 or any other suitable module can determine when the value of the calibration data corresponds to a gain compression equal to about that used to generate the shaping table of the shaping table module 82. For example, when the shaping table of the shaping table module 82 is generated at a 2 dB gain compression, the calibration module 80 can determine when the output power measured by the power detector 86 is about 2 dB less than the output power measured when the power amplifier system was configured in a state having substantially no gain compression.

The calibration data associated with a power amplifier gain compression equal to that used to generate the shaping table of the shaping table module 82 can be stored in the power amplifier system, such as in a memory of the envelope tracker 22. The calibration data can be used to compensate for an envelope amplitude misalignment of the power amplifier system.

The calibration scheme described above can be relatively low cost, take a relatively short amount of time, and can be used to account for envelope amplitude misalignment errors from a variety of sources. Additionally, using the power detector 86 for power measurements avoids a need of using external test equipment to support the calibration.

In certain implementations, the calibration module 80 can be used to perform a factory-level calibration of the envelope tracker 22 during manufacture. However, in other implementations, the calibration module 80 can periodically calibrate the envelope tracker 22 during real-time operation, thereby accounting for dynamic errors from temperature or other environmental factors and/or operating conditions that can vary the envelope amplitude misalignment error dynamically over time. The calibration can be performed during any suitable time window, such as certain time instances when the power amplifier system is not transmitting a signal over the antenna 14.

Figure 7:
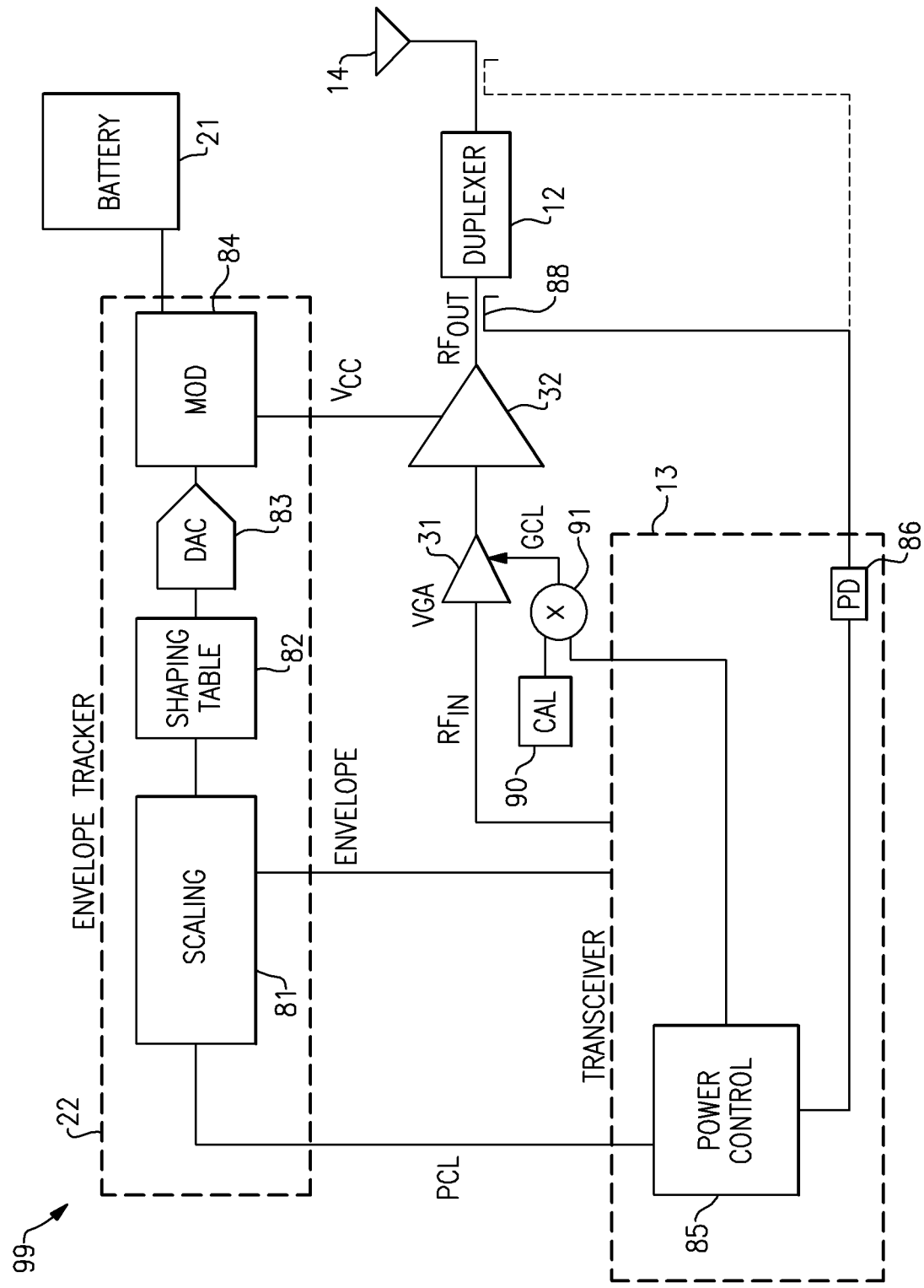
FIG. 7 is a schematic block diagram of a power amplifier system in accordance with another embodiment.

FIG. 7 is a schematic block diagram of a power amplifier system 99 in accordance with another embodiment. The power amplifier system 99 includes a duplexer 12, a transceiver 13, an antenna 14, a battery 21, an envelope tracker 22, a VGA 31, a power amplifier 32, and a directional coupler 88.

The illustrated envelope tracker 22 includes a scaling module 81, a shaping table module 82, a digital-to-analog converter 83, and a modulator 84. The power amplifier system of FIG. 7 can be similar to the power amplifier system of FIG. 6 described above. However, in contrast to the power amplifier system 98 illustrated in FIG. 6, the power amplifier system 99 illustrated in FIG. 7 includes a calibration module 90 and a multiplier 91 for controlling a gain of the VGA 31.

The calibration module 90 includes calibration data that can be set to a variety of values. The calibration data can be used to select the gain of the VGA 31, thereby controlling the input power provided to the power amplifier stage 32. The calibration module 32 can be used to correct an envelope amplitude misalignment of the envelope tracker, as will be described below.

The calibration module 90 can use the calibration data to calibrate the envelope tracker 22 to correct for envelope amplitude misalignment using a multi-step calibration process. For example, the calibration module 90 can begin by setting the gain of the VGA 31 to a maximum power control level, while the envelope tracker 22 can be configured to generate a power supply voltage that is of a nominal value and consistent with a target power of the power amplifier system.

When the power amplifier system is configured to have the target power, the calibration module 90 can change the state of the calibration data so as to direct the gain of the VGA 31 upward, thereby increasing the input power of the power amplifier 32.

For each increase of input power, the power detector 86 can measure the output power, and provide the measurement to the power control module 85. Using the information, the calibration module 90 or any other suitable component of the power amplifier system can determine when the value of the calibration data corresponds to a gain compression equal to about that used to generate the shaping table of the shaping table module 82. For example, when the gain of the power amplifier falls below that associated with the target power due to an increase in input power, the power amplifier system has exceeded the gain compression point of the power amplifier system.

The calibration data corresponding to when the power amplifier gain compression is equal to about the gain compression used to generate the shaping table can be stored in the power amplifier system, such as in a memory of the envelope tracker 22 or of the transceiver 13. The calibration data can be used to compensate for an envelope amplitude misalignment of the power amplifier system 99. To permit the power control module 85 to also change the gain of the VGA 31, the multiplier 91 can be included so that both the calibration module 90 and the power control module 85 can control the gain of the VGA 31. However, in certain implementations, the multiplier 91 can be replaced with other components, such as an adder, or omitted.

Figure 8:
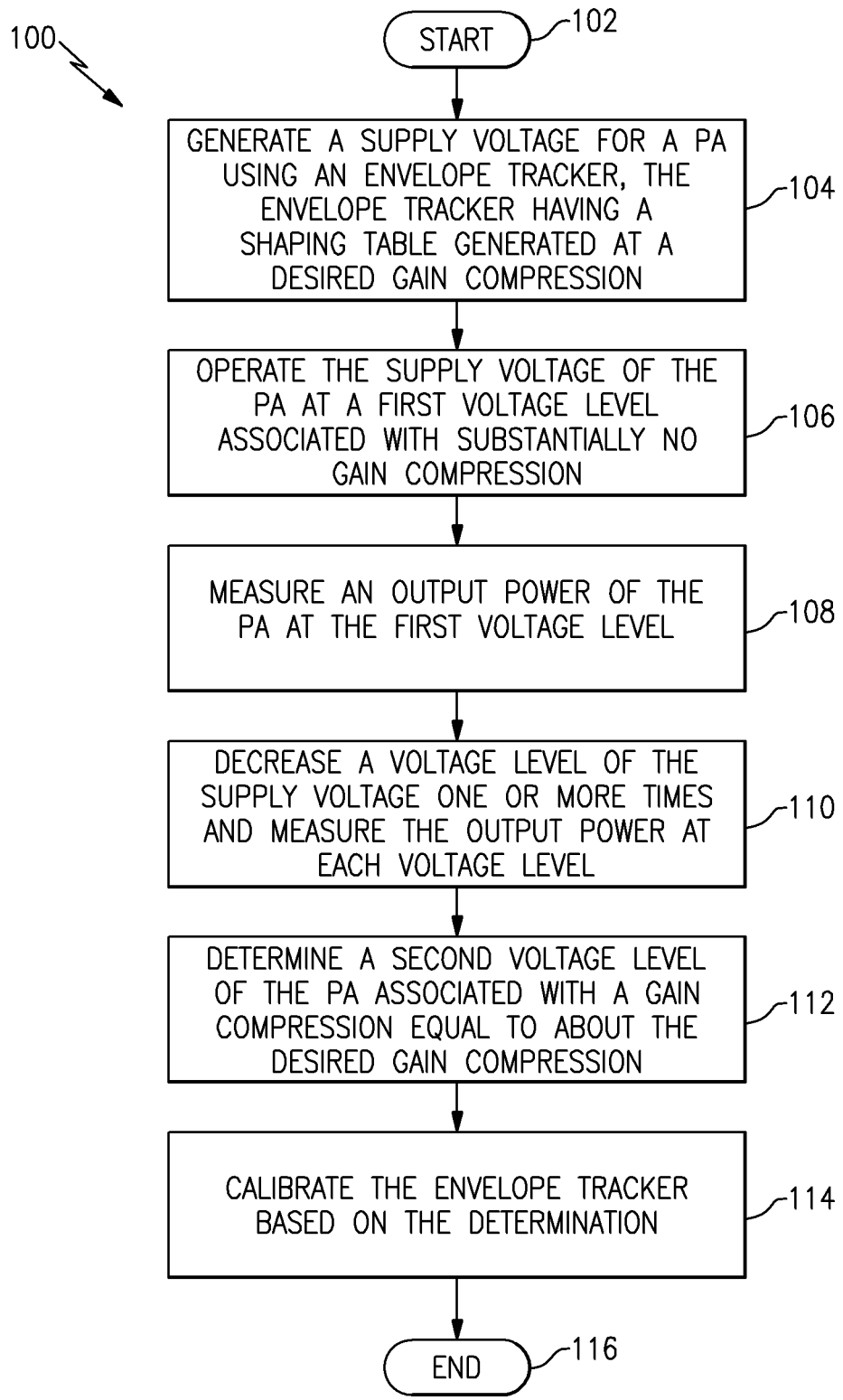
FIG. 8 is a flow chart illustrating a method of calibrating a power amplifier system in accordance with one embodiment.

FIG. 8 is a flow chart illustrating a method 100 of calibrating a power amplifier system in accordance with one embodiment. It will be understood that the methods discussed herein may include greater or fewer operations and the operations may be performed in any order, as necessary. The method 100 can be used to calibrate, for example, the power amplifier system 98 illustrated in FIG. 6.

The method 100 starts at a block 102. In an ensuing block 104, a supply voltage for a power amplifier is generated using an envelope tracker that includes a shaping table generated at a desired gain compression. Gain compression in a power amplifier can refer to a reduction in differential gain caused by overdriving the power amplifier beyond a linear region. Thus, a shaping table can be calibrated at a desired gain compression that is determined to be an acceptable level of gain compression for the design, and the envelope shaping table can map envelope signal amplitude to a power supply voltage level that corresponds to the desired gain compression. The shaping table can include shaping data relating a plurality of scaled envelope signal amplitudes to a plurality of target power supply voltage levels.

In an ensuing block 106, the supply voltage of a power amplifier is operated at a first voltage level associated with substantially no gain compression of the PA. For example, the power amplifier can be operated at a maximum power supply voltage so as to provide maximum headroom for the amplified signal and substantially no gain compression.

The method 100 of FIG. 8 continues at a block 108, in which the output power of the power amplifier is measured at the first voltage level. For example, a power detector can be used to measure the output power. Persons having ordinary skill in the art will appreciate that measuring output power can consist of measuring a current, voltage, and/or another parameter computationally related to power, and calculating power therefrom.

In an ensuing block 110, a voltage level of the supply voltage can be decreased one or more times, and the output power can be measured at each voltage level. The voltage level can be decreased discretely, with power measurements made after each decrease. However, in certain implementations the voltage level can be decreased continuously, and measurements can be made at discrete points or continuously. The power measurements can be made using a power detector or any other suitable component. In one embodiment, the supply voltage is decreased by changing calibration data in a calibration module of the power amplifier system.

The method 100 continues at a block 112, in which a second voltage level of the power supply is determined that corresponds to a gain compression equal to about the gain compression used to generate the envelope shaping table. For example, the voltage level can be decreased until the measured output power falls below the output power at the first supply voltage by an amount equal to about the gain compression of the envelope shaping table.

In an ensuing block 114, the envelope tracker is calibrated based on the determination. For example, a calibration data corresponding to the state of the system at the second voltage level can be stored and used to calibrate the power amplifier system. The method 100 ends at 116.

Figure 9:
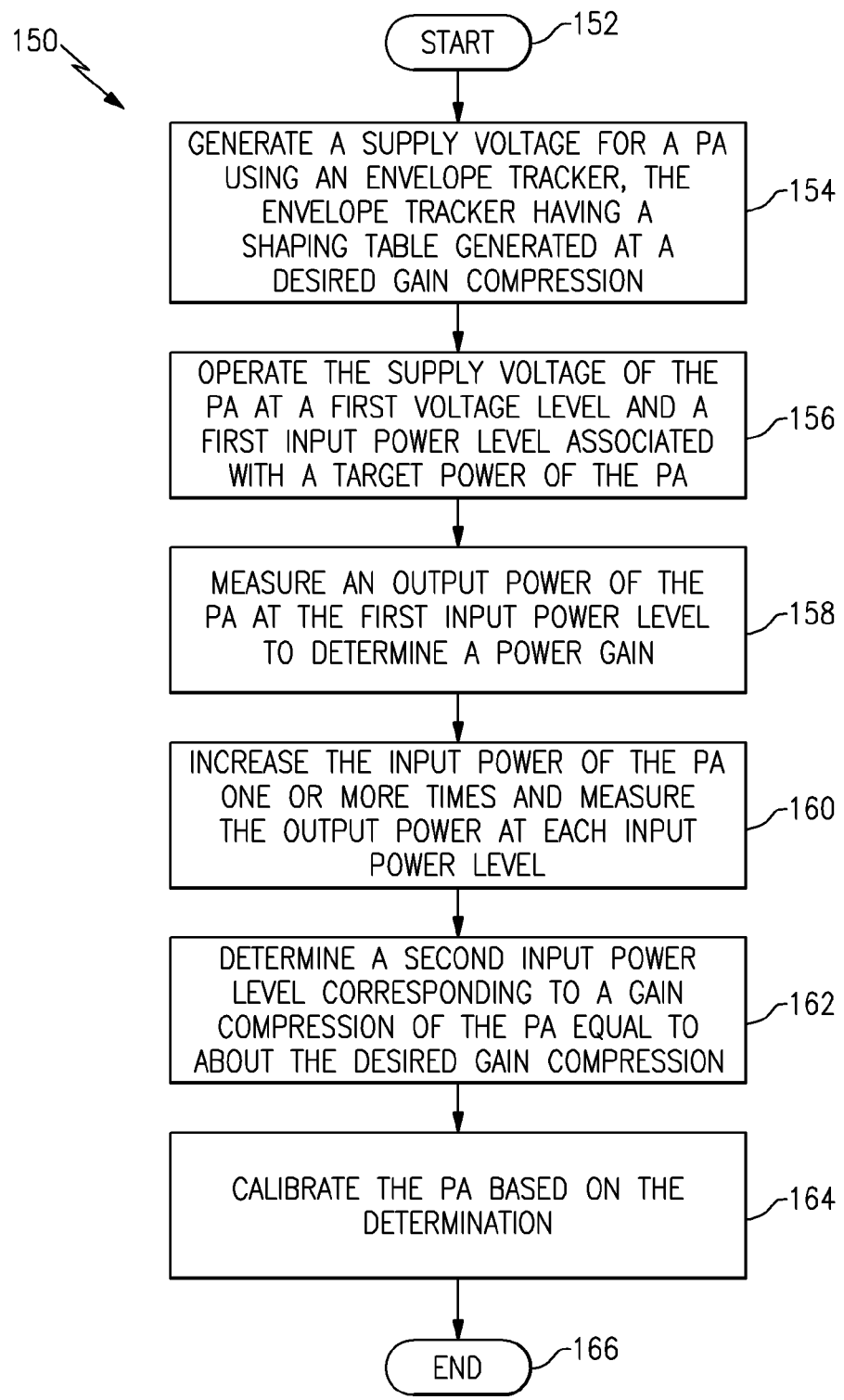
FIG. 9 is a flow chart illustrating a method of calibrating a power amplifier system in accordance with another embodiment.

FIG. 9 is a flow chart illustrating a method of calibrating a power amplifier system in accordance with another embodiment. It will be understood that the methods discussed herein may include greater or fewer operations and the operations may be performed in any order, as necessary. The method 150 can be used to calibrate, for example, the power amplifier system 99 illustrated in FIG. 7.

The method 150 starts at a block 152. In an ensuing block 154, a supply voltage for a power amplifier is generated using an envelope tracker includes a shaping table generated at a desired gain compression point. The shaping table can include shaping data relating a plurality of scaled envelope signal amplitudes to a plurality of desired supply voltage levels.

In an ensuing block 156, the supply voltage of a power amplifier is operated at a first voltage level and a first input power level associated with the target power. For example, the power amplifier can be operated at a supply voltage level below the maximum and at a relatively low input power consistent with the target power.

The method 150 of FIG. 9 continues at a block 158, in which the output power of the power amplifier is measured at the first voltage level and the first input power level to determine a power gain. For example, a power detector can be used to measure the output power.

In an ensuing block 160, an input power of the power amplifier is increased one or more times, and the output power can be measured at each voltage level. The input power can be increased in any suitable way, such as by changing the gain of a variable gain amplifier configured to drive the input of a power amplifier.

The method 150 continues at a block 162, in which a second input power level of the power supply is determined that corresponds to a gain compression equal to about the gain compression used to generate the envelope shaping table. For example, the input power can be decreased until the gain begins to decrease, thereby indicating that the gain compression has exceeded the gain compression used to determine the envelope shaping table.

In an ensuing block 164, the envelope tracker is calibrated based on the determination. For example, a calibration data corresponding to the state of the system at the second input power level can be stored and used to calibrate the power amplifier system. The method 150 ends at 166.

Applications

Some of the embodiments described above have provided examples in connection with mobile phones. However, the principles and advantages of the embodiments can be used for any other systems or apparatus that have needs for power amplifier systems.

Such power amplifier systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method of calibrating an envelope tracking system, the method comprising:
    generating a supply voltage for a power amplifier using an envelope tracker having an envelope shaping table including shaping data generated at a desired gain compression of the power amplifier relating a plurality of scaled envelope signal amplitudes to a plurality of supply voltage levels;
    operating the supply voltage of the power amplifier at a first voltage level, the first voltage level associated with substantially no gain compression of the power amplifier;
    measuring an output power of the power amplifier at the first voltage level;
    decreasing a voltage level of the supply voltage one or more times and measuring the output power at each decreased voltage level;
    determining a gain compression at each of the decreased voltage levels;
    determining a second voltage level of the supply voltage of the power amplifier corresponding to one of the decreased voltage levels that is associated with the determined gain compression equal to about that of the desired gain compression;
    retrieving the scaled envelope signal amplitude associated with the second voltage level from the envelope shaping table; and
    calibrating the envelope tracker based on the retrieved scaled envelope signal amplitude to correct for an envelope amplitude misalignment of the envelope tracker.

2. The method of claim 1 further comprising scaling an amplitude of an envelope signal to generate a scaled envelope signal, the supply voltage generated at least in part based on the scaled envelope signal.

3. The method of claim 2 wherein the shaping data maps each of the plurality of scaled envelope signal amplitudes to a corresponding one of the plurality of supply voltage levels.

4. The method of claim 3 further comprising generating the supply voltage from a battery voltage using the shaping data and the scaled envelope signal.

5. The method of claim 4 wherein the shaping data is in a digital format, the method further comprising converting the shaping data into an analog format.

6. The method of claim 2 wherein decreasing the voltage level of the supply voltage includes changing calibration data of the envelope tracker to reduce the supply voltage.

7. The method of claim 6 wherein calibrating the envelope tracker includes selecting a value of the calibration data equal to about a value of the calibration data corresponding to the second voltage level.

8. The method of claim 6 wherein scaling the amplitude of the envelope signal includes multiplying the envelope signal by a scaling factor determined at least in part by the calibration data.

9. The method of claim 8 wherein the scaling factor is further determined by a power control signal from a transceiver.

10. The method of claim 1 wherein measuring the output power of the power amplifier at the first voltage level includes measuring the output power using a directional coupler and a power detector electrically coupled to the output of the power amplifier.

11. The method of claim 1 wherein the first voltage level is equal to about a maximum supply voltage of the power amplifier.

12. The method of claim 1 wherein decreasing the voltage level of the supply voltage one or more times includes decreasing the voltage level in discrete steps.

13. The method of claim 1 wherein decreasing the voltage level of the supply voltage one or more times and measuring the output power at each decreased voltage level includes decreasing the voltage level continuously and measuring the output power at a plurality of discrete voltage levels.

14. A non-transitory computer-readable storage medium comprising instructions that when executed by a processor perform a method of calibrating an envelope tracking system, the method comprising:
    generating a supply voltage for a power amplifier using an envelope tracker, the envelope tracker having an envelope shaping table including shaping data generated at a desired gain compression of the power amplifier relating a plurality of scaled envelope signal amplitudes to a plurality of supply voltage levels;
    operating the supply voltage of the power amplifier at a first voltage level, the first voltage level associated with substantially no gain compression of the power amplifier;
    measuring an output power of the power amplifier at the first voltage level;
    decreasing a voltage level of the supply voltage one or more times and measuring the output power at each voltage level;
    determining a gain compression at each of the decreased voltage levels;
    determining a second voltage level of the supply voltage of the power amplifier corresponding to one of the decreased voltage levels that is associated with the determined gain compression equal to about that of the desired gain compression;
    retrieving the scaled envelope signal amplitude associated with the second voltage level from the envelope shaping table; and
    calibrating the envelope tracker based on the retrieved scaled envelope signal amplitude to correct for an envelope amplitude misalignment of the envelope tracker.

15. A power amplifier system comprising:
    a power amplifier;
    an envelope tracker configured to generate a supply voltage for the power amplifier, the envelope tracker including a shaping module having an envelope shaping table including shaping data generated at a desired gain compression of the power amplifier relating a plurality of scaled envelope signal amplitudes to a plurality of supply voltage levels, the envelope tracker further including a scaling module configured to scale an amplitude of an envelope signal and to provide the scaled envelope signal amplitude to the shaping module;
    a directional coupler electrically connected to an output of the power amplifier;
    a power detector electrically connected to the directional coupler and configured to measure the output power of the power amplifier using the directional coupler; and a calibration module configured to provide calibration data to the scaling module so as to change the scaled envelope signal amplitude generated by the scaling module, the calibration module configured to set the calibration data to a first value corresponding to a voltage level of the supply voltage associated with substantially no gain compression, and to reduce the voltage level of the supply voltage by changing the calibration data until the power detector indicates that the gain compression of the power amplifier is equal to about the desired gain compression to provide a reduced voltage level, the scaled envelope signal amplitude associated with the reduced voltage level in the envelope shaping table is used to calibrate the envelope tracker to correct for an envelope amplitude misalignment of the envelope tracker.

16. The power amplifier system of claim 15 wherein the shaping data maps each of the plurality of scaled envelope signal amplitudes to a corresponding one of the plurality of supply voltage levels.

17. The power amplifier system of claim 16 further comprising a modulator configured to generate the supply voltage from a battery voltage using the shaping data.

18. The power amplifier system of claim 17 further comprising a digital-to-analog converter for converting the shaping data to analog data for use by the modulator.

19. The power amplifier system of claim 15 further comprising a power control module electrically connected to the power detector.

20. The power amplifier system of claim 19 wherein the scaling module is further configured to receive a power control signal from the power control module, the scaling module configured to change the scaled envelope signal amplitude using the power control signal.

21. The power amplifier system of claim 20 wherein the scaling module is configured to multiply the calibration data by the power control signal to generate a scaling factor, and to multiply the amplitude of the envelope signal by the scaling factor to generate the scaled envelope signal amplitude.

22. The power amplifier system of claim 15 wherein the first value of the calibration data corresponds to about a maximum supply voltage of the power amplifier.

23. The power amplifier system of claim 15 further comprising a duplexer having an input electrically connected to an output of the power amplifier and to the directional coupler and an output electrically connected to an antenna.

* * * * *